United States Patent
Kazama

Patent Number: 5,990,697
Date of Patent: Nov. 23, 1999

[54] ELECTROCONDUCTIVE CONTACT UNIT HAVING COMPRESSION SPRING WITH NORMALLY AND COARSELY WOUND SEGMENTS

[75] Inventor: Toshio Kazama, Nagano, Japan

[73] Assignee: NHK Spring Co., Ltd., Yokohama, Japan

[21] Appl. No.: 08/884,100

[22] Filed: Jun. 27, 1997

[30] Foreign Application Priority Data

Jun. 28, 1996  [JP]  Japan ..................... 8-188198

[51] Int. Cl.$^6$ .............. G01R 1/067; G01R 1/04; G01R 31/02; H01R 13/24

[52] U.S. Cl. .............. 324/761; 324/72.5; 324/754; 439/841

[58] Field of Search .............. 324/754, 756–758, 324/761, 72.5; 439/482, 700, 840, 841

[56] References Cited

U.S. PATENT DOCUMENTS

| | | | |
|---|---|---|---|
| 3,364,302 | 1/1968 | Slick | 439/841 X |
| 5,014,004 | 5/1991 | Kreibich et al. | 324/761 |
| 5,084,673 | 1/1992 | Kazama | 324/761 |
| 5,189,364 | 2/1993 | Kazama | 324/72.5 X |
| 5,200,695 | 4/1993 | Kazama | 324/72.5 X |
| 5,410,260 | 4/1995 | Kazama | 324/758 |
| 5,414,369 | 5/1995 | Kazama | 324/758 |
| 5,631,574 | 5/1997 | Kazama | 324/761 |
| 5,798,655 | 8/1998 | Kazama et al. | 324/761 |

*Primary Examiner*—Gerard Strecker
*Attorney, Agent, or Firm*—Skjerven, Morrill, MacPherson, Franklin & Friel; Alan H. MacPherson

[57] ABSTRACT

In an electroconductive contact unit including a pair of needle members projecting from either end of a holder arrangement, and an electroconductive compression coil spring interposed therebetween for resiliently urging the needle members away from each other, the compression coil spring comprises a normally wound segment and a coarsely wound segment. When the contact unit is applied to an object to be contacted, the adjacent turns of the coil wire of the normally wound segment are brought into contact with each other so that the electric path between the needle members is substantially straight along the length of the coil spring with the coarsely wound segment. Therefore, by selecting the number of turns and the coil pitch of the coarsely wound segment of the compression coil spring, it is possible to minimize the electric impedance and the electric resistance of the compression coil spring while meeting the requirements of the compression coil spring for providing a required resiliency to the needle members.

11 Claims, 3 Drawing Sheets

5,990,697

ELECTROCONDUCTIVE CONTACT UNIT HAVING COMPRESSION SPRING WITH NORMALLY AND COARSELY WOUND SEGMENTS

CROSS REFERENCE TO RELATED PATENTS AND PATENT APPLICATIONS

The contents of the following patents and patent applications may be related to the invention of this application, and the contents of these patents and patent applications are incorporated in this application by reference.

PCT/JP97/01237 filed Apr. 10, 1997
PCT/JP96/03791 filed Dec. 25, 1996
U.S. Pat. No. 5,798,655 issued Aug. 25, 1998
U.S. Pat. No. 5,631,574 issued May 20, 1997
U.S. Pat. No. 5,414,369 issued May 9, 1995
U.S. Pat. No. 5,410,260 issued Apr. 25, 1995

TECHNICAL FIELD

The present invention relates to an electroconductive unit which is suitable for use in contact probe units, electric sockets and other devices for establishing an electric contact. In particular, the present invention is related to an electroconductive contact unit suitable for use in contact probes for testing semiconductor wafers and bare chips which are obtained by dicing a semiconductor wafer as well as for testing printed circuit boards.

BACKGROUND OF THE INVENTION

Various types of contact probes have been used for electrically testing printed circuit boards and semiconductor devices. The electroconductive contact unit used in such conventional contact probes typically comprises a compression coil spring retained in a holder, and a pair of needle members received coaxially in the holder and resiliently projecting from either end of the holder. Normally, the needle members are electrically connected to the compression coil spring by soldering so that an electric signal received from one of the needle members is transmitted to the other needle member involving a relatively small electric resistance.

However, when the signal to be transmitted consists of a high frequency signal, the electric signal is required to be conducted by the compression coil spring, and the electric inductance of the coil spring may cause an undesired impedance to the electric signal.

Recently with the increase in the frequency of the signals that are required to be processed by semiconductor devices, it has become customary to use high frequency signals of up to several hundred MHz for testing semiconductor devices and printed circuit boards. As a result, there has been an increasing demand for the capability of such electroconductive contact units to handle such high frequency signals. In other words, the inductance and resistance of such electroconductive contact units are required to be reduced more than before.

Also, such electroconductive contact units are required to be compact in size so as to be arranged extremely close to each other, and to be provided with a sufficient resiliency so as to accommodate any irregularities in the surface states of the parts to be contacted.

BRIEF SUMMARY OF THE INVENTION

In view of such problems of the prior art, a primary object of the present invention is to provide an electroconductive contact unit which is low in inductance and resistance.

A second object of the present invention is to provide an electroconductive contact unit which is compact in size.

A third object of the present invention is to provide an electroconductive contact unit which is provided with a sufficient resiliency to accommodate any irregularities in the surface states of the parts to be contacted.

According to the present invention, such objects can be accomplished by providing an electroconductive contact unit, comprising: a holder defining an axial bore having a first end and a second end and surrounded by an electrically insulated wall surface; an electroconductive compression coil spring coaxially received in the axial bore; a first contact member fitted in the first end of the axial bore and engaged by a first end of the compression coil spring; and a second contact member slidably fitted in the second end of the axial bore and engaged by a second end of the compression coil spring; the second contact member being resiliently urged out of the axial bore by the compression coil spring and having a forward end adapted to be brought into contact with an object to be contacted; wherein the compression coil spring comprises a normally wound segment and a coarsely wound segment.

Therefore, when the contact unit is applied to the object to be contacted, and the compression coil spring is compressed to such an extent that the coil wire of the adjoining turns of the normally wound segment is brought into contact with each other, the electric signal is allowed to pass axially through the coil wire with the exception of the coarsely wound segment of the compression coil spring. By selecting the number of turns and the coil pitch of the coarsely wound segment of the compression coil spring, it is possible to minimize the electric impedance and the electric resistance of the compression coil spring while meeting the requirements of the compression coil spring for providing a required resiliency at least to the second contact member. The present invention is useful for testing purpose, but may also be used for a wide range of applications where electric contacts are required to be established such as electric sockets for semiconductor devices and other electronic and electric appliances, electric connectors and so forth.

This invention is particularly suitable for use in a contact unit having two axially moveable ends. But, the first contact member may also be fixedly secured to the first end of the axial bore while only the second contact member is allowed to be resiliently moveable in the axial direction. Typically, the normally wound segment of the compression coil spring is provided with such a coil pitch and a number of turns which cause the coil wire of the normally wound segment to be substantially in contact with each other when the contact unit is applied to an object to be contacted. Also, the coarsely wound segment of the compression coil spring should be provided with such a number of turns and a coil pitch which allow the second contact member to be resiliently displaced within a tolerated range of displacement for the second contact member when the contact unit is applied to an object to be contacted.

According to a preferred embodiment of the present invention, the holder comprises at least one middle plate, and a pair of outer plates placed on either side of the middle plate, the axial bore being defined by a through hole passed through the middle plate, the outer plates being each provided with a hole coaxially aligned with the axial bore and having a smaller inner diameter than the axial bore. Because no tubular member is required for defining each holder for the contact members and the compression coil spring, this embodiment allows a large number of contact units to be arranged very close to each other so that highly finely arranged parts of semiconductor devices and printed circuit boards can be tested.

Typically, the second contact member comprises a needle member including a pointed outer end for establishing a favorably contact with the part to be contacted, a main part slidably received in the hole of a corresponding one of the outer plates, and a base end having a diameter smaller than the axial bore but larger than the hole of the outer plate and received in the axial bore so as to precisely control the extent by which the needle member projects out of the axial bore.

To ensure a favorably electric contact between the compression coil spring and the needle member, the needle member may further comprise an axial projection projecting inwardly and coaxially from the base end of the needle member, and a corresponding one of the compression coil spring is tightly wound around the axial projection of the needle member. If desired, a corresponding one of the compression coil spring may be wound around the axial projection of the needle member, and soldered to the projection. To adapt the contact unit to a wide range of applications, the two axial ends of the contact unit may be provided with a substantially identical structure.

So as to maximize the resiliency which the compression coil spring provides, and minimize the impedance and the electric resistance which the compression coil spring involves, it is preferable (1) if the normally wound segment of the compression coil spring is provided with such a coil pitch and a number of turns as to cause the coil wire of the normally wound segment to be substantially in contact with each other when only one of the needle members is pushed into the axial bore by a prescribed distance; and (2) if the coarsely wound segment of the compression coil spring is provided with such a number of turns and a coil pitch as to allow the other of the needle members to be resiliently displaced within a tolerated range of displacement for the other needle member.

BRIEF DESCRIPTION OF THE DRAWINGS

Now the present invention is described in the following with reference to the appended drawings, in which.

DETAILED DESCRIPTION OF THE PREFERRED EMBODIMENTS

Figure 1:
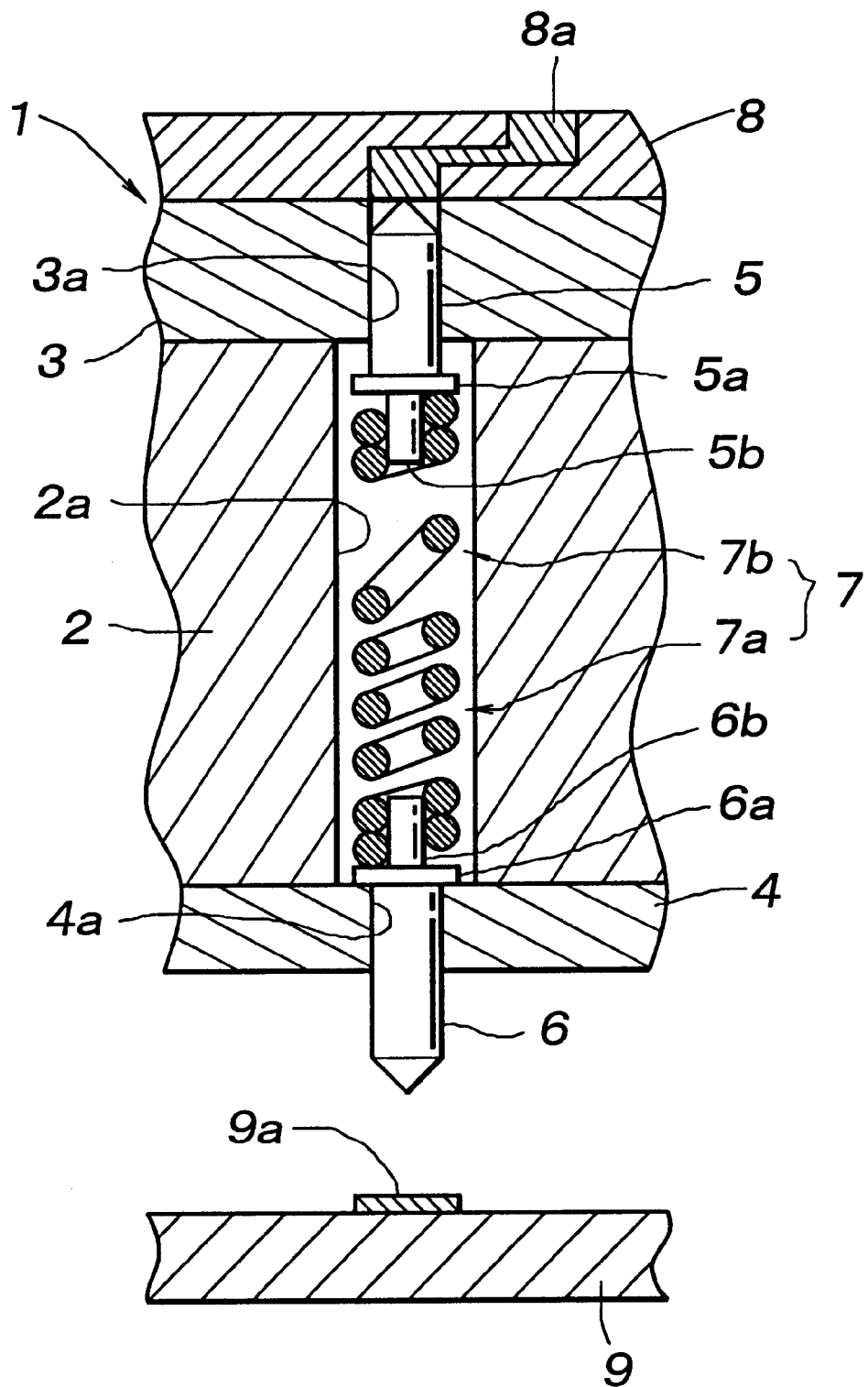
FIG. 1 is a schematic sectional view of an electroconductive contact unit according to the present invention.

FIG. 1 shows a preferred embodiment of the present invention which consists of an electroconductive contact unit 1 having two moveable contact ends. This electroconductive contact unit 1 is suited for use in a contact probe board incorporated with a large number of such electroconductive contact units arranged one next to the other with a small gap therebetween. In the most part of the following description, only one of the electroconductive contact units is mentioned for the convenience of description.

This contact probe board is adapted to be mounted to a test unit illustrated above the contact probe board in the drawings, and brought into contact with an object to be tested illustrated under the contact probe board in the drawings. Also, the actual electroconductive contact units are highly elongated in the axial direction, but for the convenience of illustration, the electroconductive contact units are illustrated shorter than they actually are.

The holder for the contact unit 1 comprises a relatively thick middle insulating plate 2, and an upper insulating plate 3 and a lower insulating plate 4 placed on the upper and lower surfaces of the middle insulating plate 2. The middle insulating plate 3 is provided with a plurality of through holes or axial bores 2a (although only one of them is shown in the drawing), and the upper and lower insulating plates 3 and 4 are provided with support holes 3a and 4a which are coaxially aligned with the corresponding axial bore 2a and slightly reduced in diameter from the axial bore 2a. The middle insulating plate 2, and the upper and lower insulating plates 3 and 4 are securely joined to each other in this state by fastening means which is not shown in the drawing. These plates are made of insulating material such as plastics, but may also made of electroconductive material such as metals and alloys if the interior of the holes 2a, 3a and 4a are coated with an insulating material.

A needle member 5 is slidably received in the support hole 3a of the upper insulating plate 3. The needle member 5 comprises a main part slidably received in the support hole 3a, a pointed end projecting from the upper or outer end of the support hole 3a, a flange 5a formed at a base end of the main part of the needle member 5, and a projection 5b coaxially and inwardly projecting from the flange 5a. The flange 5a is smaller in diameter than the inner diameter of the axial bore 2a, but is larger in diameter than the support hole 3a. The lower support hole 4a similarly supports a similar needle member 6 which comprises a main part slidably received in the support hole 4a, a pointed end projecting from the lower or outer end of the support hole 4a, a flange 6a formed at a base end of the main part of the needle member 6, and a projection 6b coaxially and inwardly projecting from the flange 6a.

An electroconductive compression coil spring 7 is received in the axial bore 2a, and is interposed between the upper and lower needle members in a pre-compressed state. Each end of the compression coil spring 7 is wrapped around the projection 5b or 6b of the projection 5a or 6a of the corresponding needle member 5 or 6, and a desired electric connection between them is established either by wrapping the coil wire around the projection tightly and/or with the aid of soldering.

When this contact unit 1 is used for testing a semiconductor wafer, the contact probe board is secured to a base board 8 of the testing equipment, for instance by using threaded bolts passed through the insulating plates 2, 3 and 4, and the base board 8. Terminal ends of internal conductors 8a of the base board 8 serving a part of an electric circuit are exposed on the surface (the lower surface in the drawing) of the base board 8 opposing the contact probe board.

Figure 2:
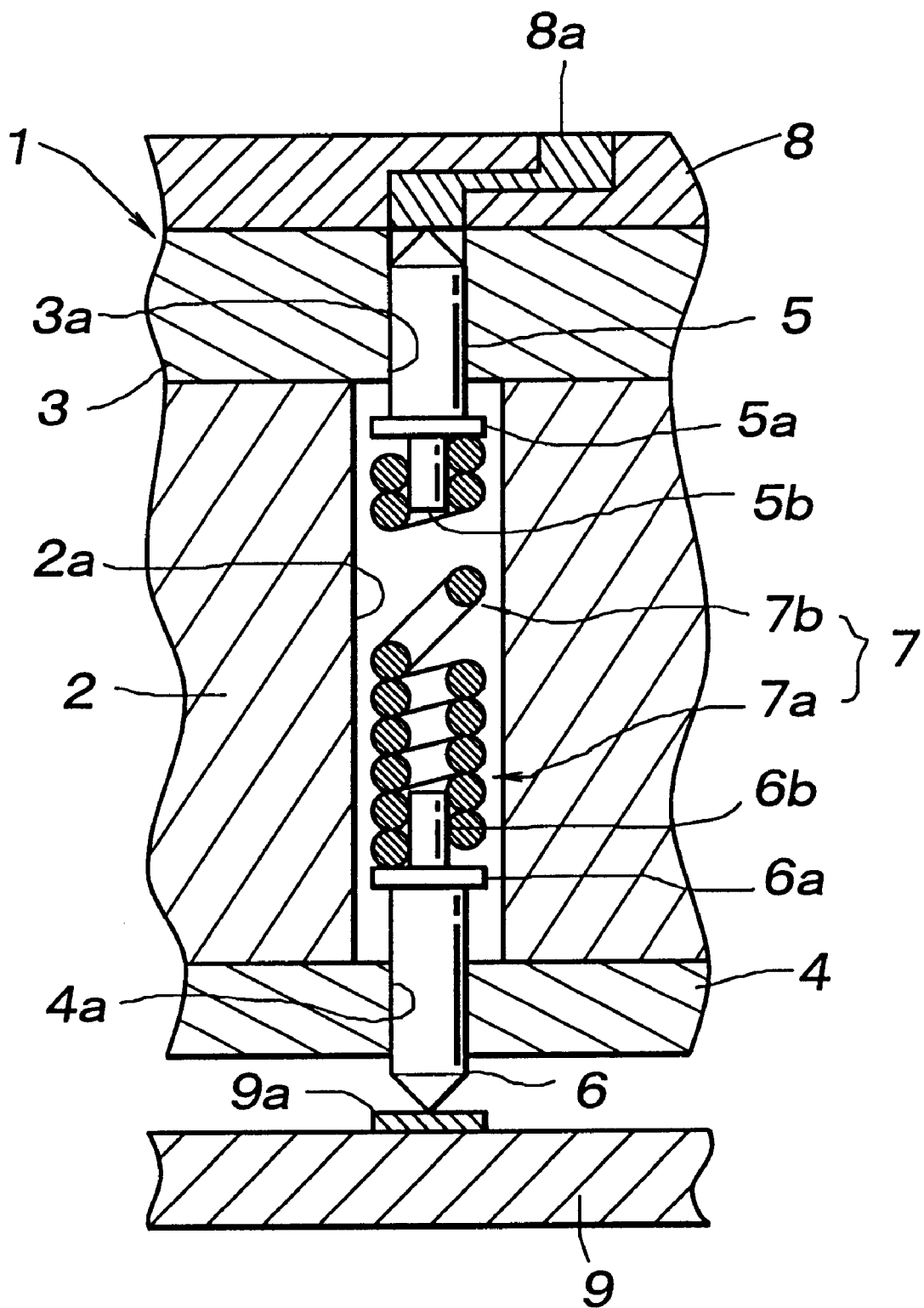
FIG. 2 is a view similar to FIG. 1 when the contact unit is applied to a work pad.

With the contact probe board attached to the base board 8, the entire assembly is placed close to a work 9 until the projecting end of the lower needle member 6 comes into contact with a work pad 9a and is at least slightly pushed into the support hole 4a against the spring force of the compression coil spring 7, as illustrated in FIG. 2.

When an electric connection is thus established, the electric inductance H of the compression coil spring 7 can be given by the following equation:

$$H = A \cdot N^2 / L$$

where A is a constant coefficient, N is the number of turns of the coil wire, and L is the length of the coil spring. Therefore, to reduce the electric inductance, it is desirable to minimize the number of turns of the coil wire. On the other hand, for the compression coil spring to have a desired resiliency and a required compression stroke, a certain number of turns is necessary.

In this embodiment, the compression coil spring 7 comprises a normally wound segment 7a and a coarsely wound segment 7b, in addition to the relatively tightly wound segments at either axial end thereof. When the coil wire consists of a uniform wire, the coarsely wound segment 7b has a larger spring constant than the normally wound segment 7a.

When the contact unit 1 is mounted to the base board 8, the upper needle member 5 comes into contact with the internal conductor 8a, and the normally would portion 7a of the compression coil spring is compressed, and the adjacent turns of the coil wire is substantially in contact with each other. When the contact probe board is applied to the work 9, the coarsely wound segment 7b of the compression coil spring 7 is compressed.

The coarsely wound segment 7b, for instance, comprises a few turns of the coil wire, and forms the only coil shaped electroconductive path existing between the two needle members 5 and 6 when the contact probe is applied to the work pad 9a. Therefore, the electric inductance of the compression soil spring 7 can be significantly reduced from that of the more conventional compression coil spring which defines a spiral electroconductive path substantially over its entire length. According to the present invention, the coarsely wound segment, for instance, may consist of a single turn, and as would be appreciated by substituting this number in the above equation, the electric inductance of the contact unit can be minimized. If the required resiliency can be obtained, the coarsely wound segment may even consist of less than one turn.

Preferably, the number of turns of the coarsely wound portion 7b is reduced insofar as possible to be able to accommodate any difference in the height of the work pads 9a. For instance, if the height of the work pads 9a is controlled in such a manner that any fluctuations in the height of the work pads 9a can be accommodated by a single turn of the coarsely wound segment 7b, the entire electric inductance of each compression coil spring is accounted for by the coarsely wound segment. Furthermore, the difference of electric inductance from one compression coil spring to another is no more than that caused by the difference in length of the compression coil springs, and can be therefore extremely small. The uniformity of the electric conductance of different electric paths is highly significant in high speed digital circuits as well known in the art.

Figure 3:
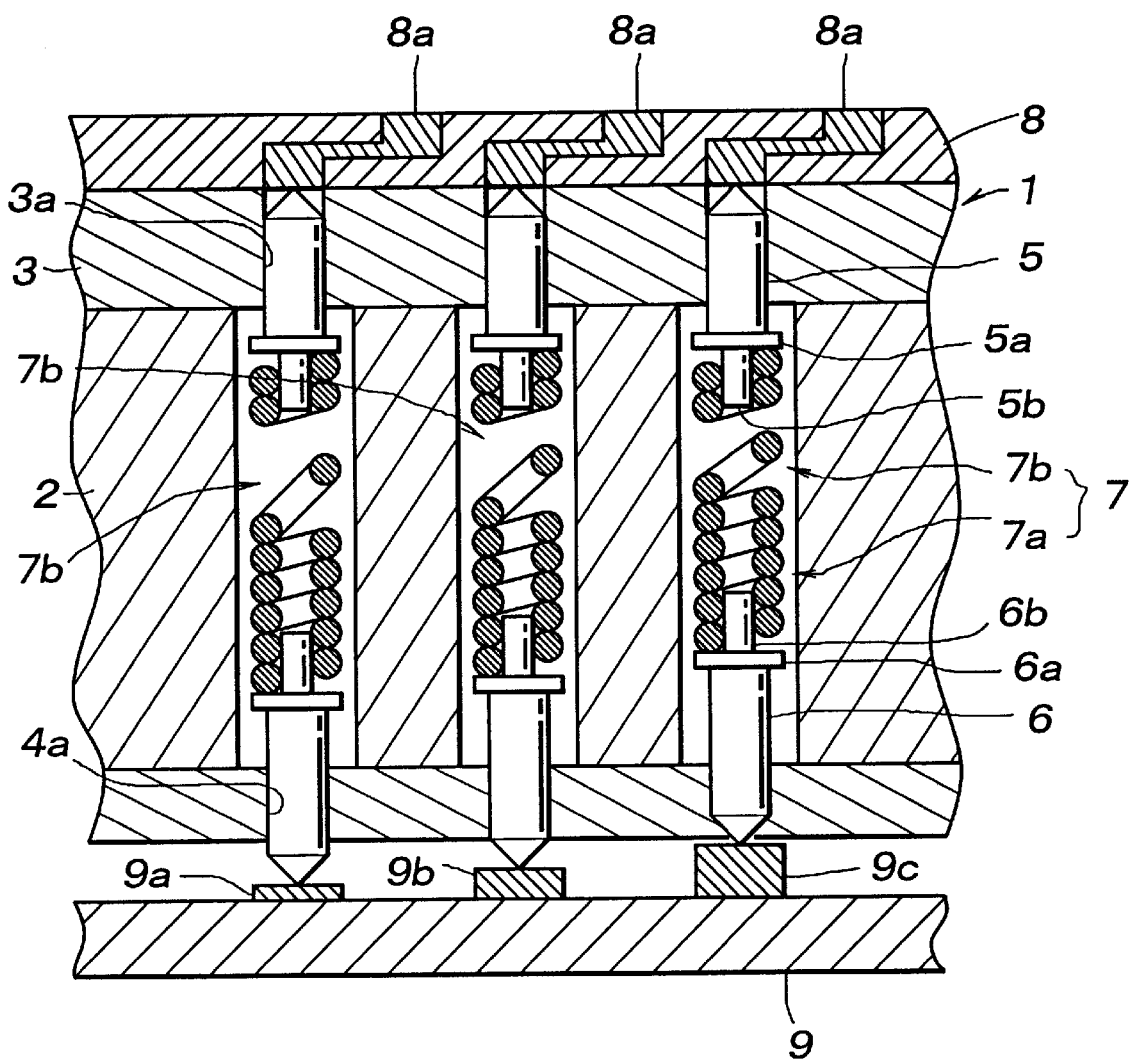
FIG. 3 is a view showing three contact units which are applied to work pads having different heights.

FIG. 3 illustrates three contact units applied to work pads 9a, 9b and 9c of increasing height. The normally wound segment 7a of each of the three contact units is fully compressed, such that the coil wire of the adjoining turns is brought into contact with each other. The coarsely wound segment 7b of the compression coil spring 7 associated with the contact unit in contact with work pad 9b is compressed more than the coarsely wound segment 7b associated with work pad 9a, but less than the coarsely wound segment 7b associated with work pad 9c.

Also, the reduction in the number of turns of the coarsely wound segment is effective in reducing the electric resistance of the compression coil spring, and is highly desirable particularly when a large electric current is required to be conducted through the compression coil spring.

Although the present invention has been described in terms of a preferred embodiment thereof, it is obvious to a person skilled in the art that various alterations and modifications are possible without departing from the scope of the present invention which is set forth in the appended claims.

What we claim is:

1. An electroconductive contact unit, comprising:
    a holder defining an axial bore having a first end and a second end and surrounded by an electrically insulated wall surface;
    an electroconductive compression coil spring coaxially received in said axial bore, said compression coil spring including a relatively tightly wound first end, a relatively tightly wound second end, a normally wound segment, and a coarsely wound segment, said normally and coarsely wound segments being disposed between said first and second ends with said normally wound segment adjacent to said coarsely wound segment, each segment having a coil pitch and at least one turn, said coarsely wound segment having a larger coil pitch and a fewer number of turns than said normally wound segment;
    a first contact member fitted in said first end of said axial bore and engaged by the first end of said compression coil spring; and
    a second contact member slidably fitted in said second end of said axial bore and engaged by the second end of said compression coil spring, said second contact member being resiliently urged out of said axial bore by said compression coil spring and having a forward end adapted to be brought into contact with an object to be contacted,
    wherein cooperation between said normally and coarsely wound segments of said compression coil spring reduces an electric inductance and an electric resistance of the compression coil spring.

2. An electroconductive contact unit according to claim 1, wherein said holder comprises at least one middle plate, and a pair of outer plates placed on either side of said middle plate, said axial bore being defined by a through hole passed through said middle plate, said outer plates being each provided with a hole coaxially aligned with said axial bore and having a smaller inner diameter than said axial bore.

3. An electroconductive contact unit according to claim 2, wherein said second contact member comprises a needle member including a pointed outer end, a main part slidably received in said hole of a corresponding one of said outer plates, and a base end having a diameter smaller than said axial bore but larger than said hole of said outer plate and received in said axial bore.

4. An electroconductive contact unit according to claim 3, wherein said needle member further comprises an axial projection projecting inwardly and coaxially from said base end of said needle member.

5. An electroconductive contact unit according to claim 4, wherein said first contact member comprises a needle member including a pointed outer end, a main part slidably received in said hole of a corresponding one of said outer plates, a base end having a diameter smaller than said axial bore but larger than said hole of said outer plate and received in said axial bore, and an axial projection projecting inwardly and coaxially from said base end of said needle member.

6. An electroconductive contact unit according to claim 4, wherein a corresponding one end of said compression coil spring is tightly wound around said axial projection of said needle member.

7. An electroconductive contact unit according to claim 4, wherein a corresponding one end of said compression coil spring is wound around said axial projection of said needle member, and soldered to said projection.

8. An electroconductive contact unit according to claim 5, wherein the coil pitch and the number of turns of said normally wound segment of said compression coil spring cause the coil wire of said normally wound segment to be substantially in contact with each other when only one of said needle members is pushed into said axial bore by a prescribed distance.

9. An electroconductive contact unit according to claim 8, wherein the coil pitch and the number of turns of said coarsely wound segment of said compression coil spring allow the other of said needle members to be resiliently displaced within a tolerated range of displacement for said other needle member while in use.

10. An electroconductive contact unit according to claim 1, wherein the coil pitch and the number of turns of said normally wound segment of said compression coil spring cause the coil wire of said normally wound segment to be substantially in contact with each other when said contact unit is applied to an object to be contacted.

11. An electroconductive contact unit according to claim 10, wherein the coil pitch and the number of turns of said coarsely wound segment of said compression coil spring allow said contact members to be resiliently displaced within a tolerated range of displacement when said contact unit is applied to an object to be contacted.

\* \* \* \* \*